(12) United States Patent
Ouyang

(10) Patent No.: US 7,861,769 B2
(45) Date of Patent: Jan. 4, 2011

(54) MAGNETO-HYDRODYNAMIC HOT SPOT COOLING HEAT SINK

(75) Inventor: Chien Ouyang, San Jose, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1234 days.

(21) Appl. No.: 11/256,249

(22) Filed: Oct. 21, 2005

(65) Prior Publication Data

US 2007/0089867 A1    Apr. 26, 2007

(51) Int. Cl.
*F28F 27/00* (2006.01)
*F28D 15/00* (2006.01)

(52) U.S. Cl. ............. 165/272; 165/104.17; 165/104.23; 165/104.28; 165/104.33

(58) Field of Classification Search ............ 165/104.17, 165/104.23, 104.28, 104.33, 120, 272
See application file for complete search history.

(56) References Cited

U.S. PATENT DOCUMENTS

| | | | |
|---|---|---|---|
| 5,355,942 A | 10/1994 | Conte | |
| 5,846,414 A * | 12/1998 | Cho | 210/222 |
| 6,021,844 A * | 2/2000 | Batchelder | 165/104.33 |
| 6,766,817 B2 | 7/2004 | da Silva et al. | |
| 6,833,107 B2 * | 12/2004 | Kuriyama et al. | 219/411 |
| 6,918,404 B2 | 7/2005 | Dias da Silva et al. | |
| 7,066,586 B2 | 6/2006 | da Silva et al. | |
| 7,131,286 B2 * | 11/2006 | Ghoshal et al. | 62/3.7 |
| 7,310,231 B2 * | 12/2007 | Ouyang | 361/699 |

* cited by examiner

*Primary Examiner*—Ljiljana (Lil) V Ciric
(74) *Attorney, Agent, or Firm*—Osha • Liang LLP

(57) ABSTRACT

A heat sink is configured to cool at least one hot spot of an integrated circuit. The heat sink has a first pipe and a second pipe disposed interior to and concentric with the first pipe, where at least a portion of each of the first pipe and the second pipe is arranged to be disposed vertically over the hot spot. An assembly connected to the first pipe and the second pipe is arranged to generate a magnetic field and induce electrical current flow through the magnetic field. A flow of thermally and electrically conductive fluid in the first pipe and a flow of the fluid in the second pipe are dependent on the electrical current flow and the magnetic field.

11 Claims, 9 Drawing Sheets

MAGNETO-HYDRODYNAMIC HOT SPOT COOLING HEAT SINK

BACKGROUND

A computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media (e.g., a floppy disk or a CD-ROM (not shown)). The computing portion 12, using memory and other internal components, processes both internal data and data provided to the computing portion 12 by the user to generate data requested by the user. The generated data may be provided to the user via, for example, a display device 18 or a printer 20. The computing portion 12 of a computer system typically includes various components such as, for example, a power supply, disk drives, and the electrical circuitry required to perform the necessary and requested operations of the computer system.

As shown in FIG. 2, the computing portion 12 may contain a plurality of circuit boards 22, 24, 26, 28 (e.g., printed circuit boards (PCBs) or printed wiring boards (PWBs)) on which various circuit components are implemented. For example, a computing portion designed to have enhanced sound reproducing capabilities may have a circuit board dedicated to implementing circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, logic gates) that are connected to the circuit board 22. The integrated circuits 32, 34, 36, 38, 40, 42 communicate with one another, i.e., pass data, using wires or traces of conductive material (e.g., copper (shown, but not labeled)) embedded in the circuit board 22.

In operation, an integrated circuit, such as those shown in FIG. 2, dissipates heat as a result of work performed by the integrated circuit. Energy that is needed by the integrated circuit for work is not consumed with 100% efficiency, thereby resulting in excess energy that is released, among other things, as heat. As integrated circuits become more dense (i.e., more transistors per unit area) and faster (i.e., higher operating frequencies), they generate more heat. As excessive heat is damaging to an integrated circuit both in terms of performance and component integrity, an important design consideration involves ensuring that heat dissipated by an integrated circuit is sufficiently drawn away from the integrated circuit, where the efficiency of drawing away heat from the integrated circuit is expressed in terms of what is referred to as the "heat transfer rate".

"Heat sinks" are devices that are commonly used to cool integrated circuits.

FIG. 3 shows a heat sink 50 as used with an integrated circuit 52 housed in a package 54 atop a substrate 56. The heat sink 50 is made of a high thermal conductivity metal (e.g., copper or aluminum). A "high thermal conductivity metal" is one that allows heat to pass through it because it contains many free electrons.

A base of the heat sink 50 is secured over the integrated circuit 52 by, for example, a retention clip (not shown) or an adhesive or thermal interface material (shown, but not labeled). During operation of the integrated circuit 52, the temperature of the integrated circuit 52 increases due to increased particle movement resulting from a build-up of excess energy. The increased integrated circuit temperature results in an increase in the temperature of the package 54, and consequently, of the heat sink 50. The increased temperature of the heat sink 50 results in an increase in the temperature of the air around the heat sink 50, whereby the heated air rises and effectively draws heat away from the integrated circuit 52. This process is referred to as "convection".

The removal of heat dissipated from an integrated circuit by a heat sink is dependent on numerous factors. For example, the thermal resistance of the package that houses the integrated circuit affects how much heat transfers from the integrated circuit to the heat sink. Also, the effectiveness of the adhesives between the integrated circuit and its package and the package and the heat sink affects how much heat transfers between these components. Moreover, the conductivity of the materials used in the package and the heat sink has a direct bearing on the amount of heat that is transferred away from the integrated circuit. The surface area of the heat sink is also important as more surface area results in more air being heated, thereby resulting in more heat being drawn away from the integrated circuit by the rising heated air.

SUMMARY

According to one aspect of one or more embodiments of the present invention, a computer system comprises an integrated circuit and a heat sink operatively connected to the integrated circuit, where the heat sink comprises: a plurality of fins arranged to dissipate heat; a first pipe having at least a portion oriented vertically over a hot spot of the integrated circuit; and an assembly disposed at one end of the first pipe, the assembly arranged to control fluid flow in the first pipe dependent on a magnetic field.

According to another aspect of one or more embodiments of the present invention, a method of cooling an hot spot of an integrated circuit comprises: generating a magnetic field; inducing electrical current flow through the magnetic field; propagating electrically and thermally conductive fluid through a first pipe interior to and concentric with a second pipe, where at least a portion of the first pipe and at least a portion of the second pipe are disposed vertically over the hot spot; and propagating the fluid through the second pipe outside of the first pipe, where a direction of fluid flow in the first pipe and a direction of fluid flow in the second pipe is dependent on the generating and the inducing.

According to another aspect of one or more embodiments of the present invention, a heat sink comprises: a body having a plurality of fins configured to dissipate heat; a first pipe extending through the body and having at least a portion configured to be disposed vertically over a hot spot of an integrated circuit; a second pipe disposed interior to and concentric with the first pipe; and an assembly disposed in connection with at least one of the first pipe and the second pipe, where the assembly is configured to generate a magnetic field, and where flow of thermally and electrically conductive fluid in the first pipe and flow of the fluid in the second pipe are dependent on the magnetic field.

Other aspects and advantages of the invention will be apparent from the following description and the appended claims.

DETAILED DESCRIPTION

During operation of an integrated circuit, a temperature at one region of the integrated circuit may differ from a temperature at another region of the integrated circuit. In other words, the various regions of an integrated circuit do not necessarily have the same operating temperature. Instead, some regions, herein individually referred to as a "hot spot," operate at temperatures higher than other regions. Such differences in temperature across an integrated circuit result from higher power consumption at certain regions of the integrated circuit. For example, a region of the integrated circuit that drives a frequently switching signal likely consumes more power than a region of the integrated circuit that drives a constant signal.

While typical heat sinks are designed to uniformly cool across an integrated circuit, embodiments of the present invention relate to a heat sink that is designed to specifically cool one or more hot spots of an integrated circuit. In one or more embodiments of the present invention, such a heat sink uses one or more pipes that carry fluid with a flow dependent on a magnetic field.

Figure 1:
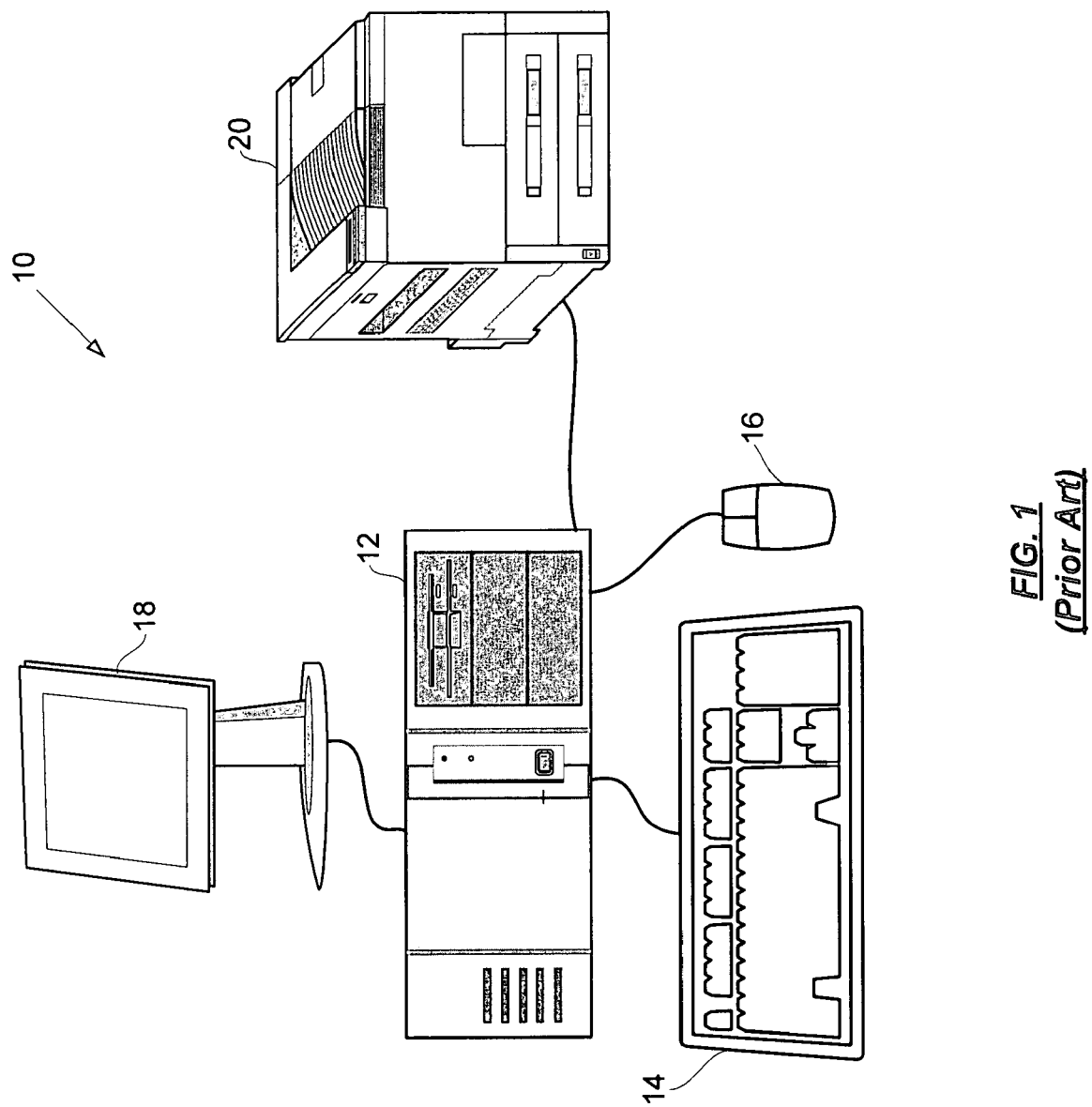
FIG. 1 shows a computer system.
Figure 2:
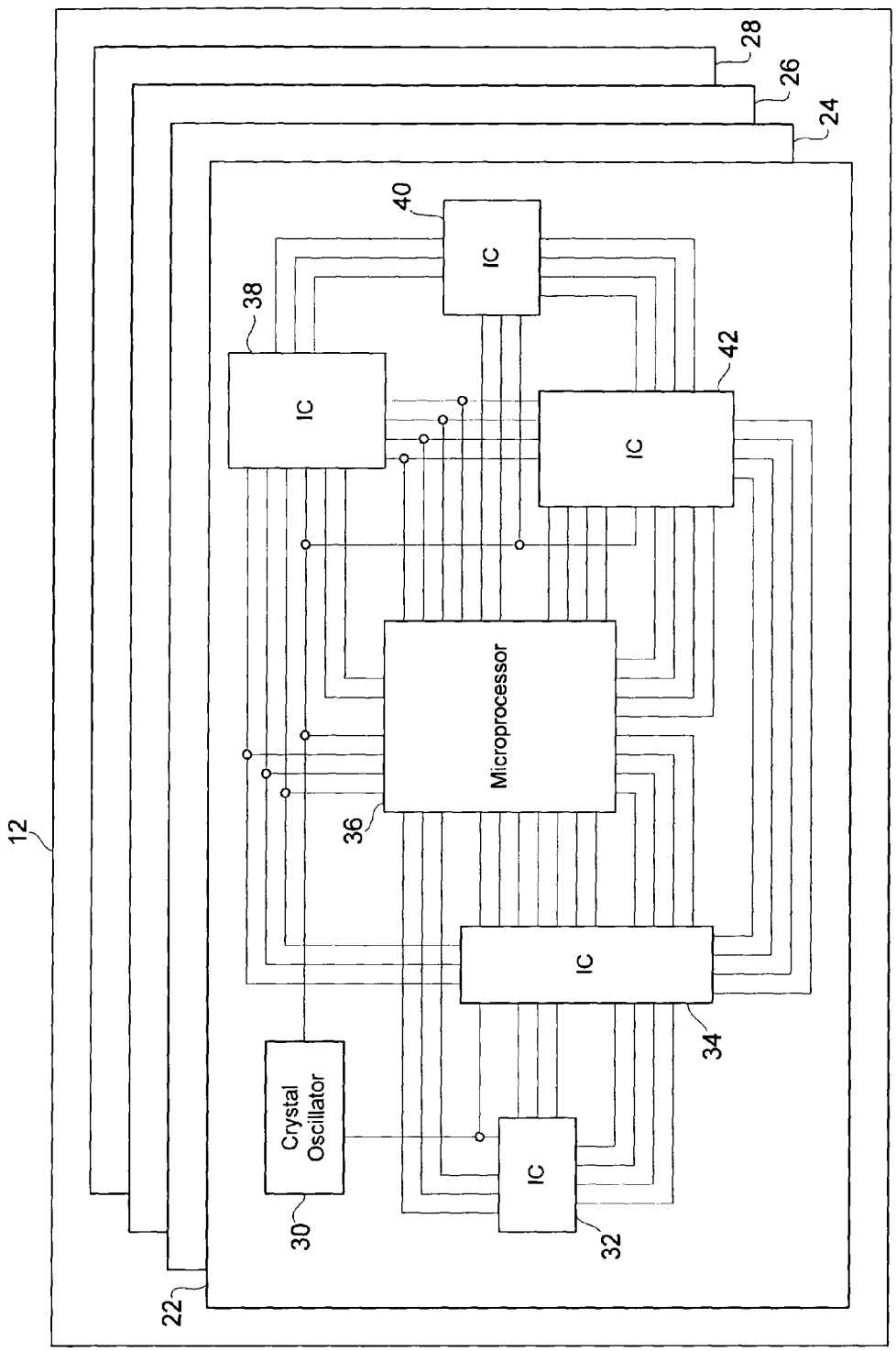
FIG. 2 shows a portion of a computer system.
Figure 3:
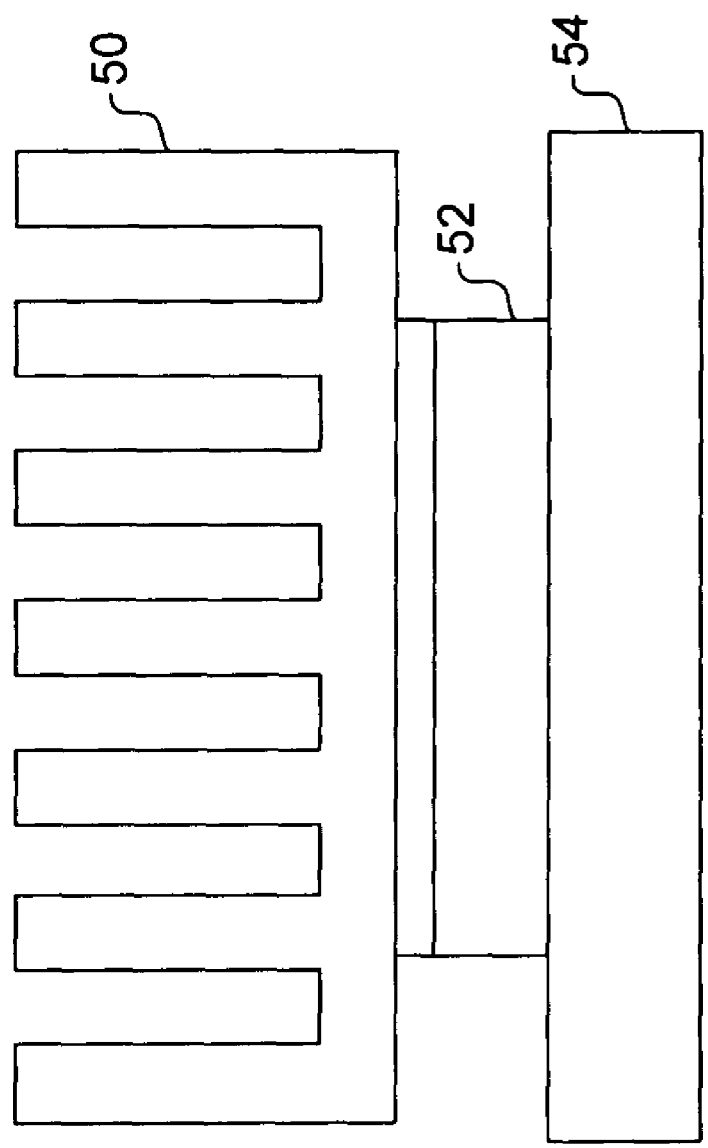
FIG. 3 shows a heat sink as used with an integrated circuit.
Figure 4A:
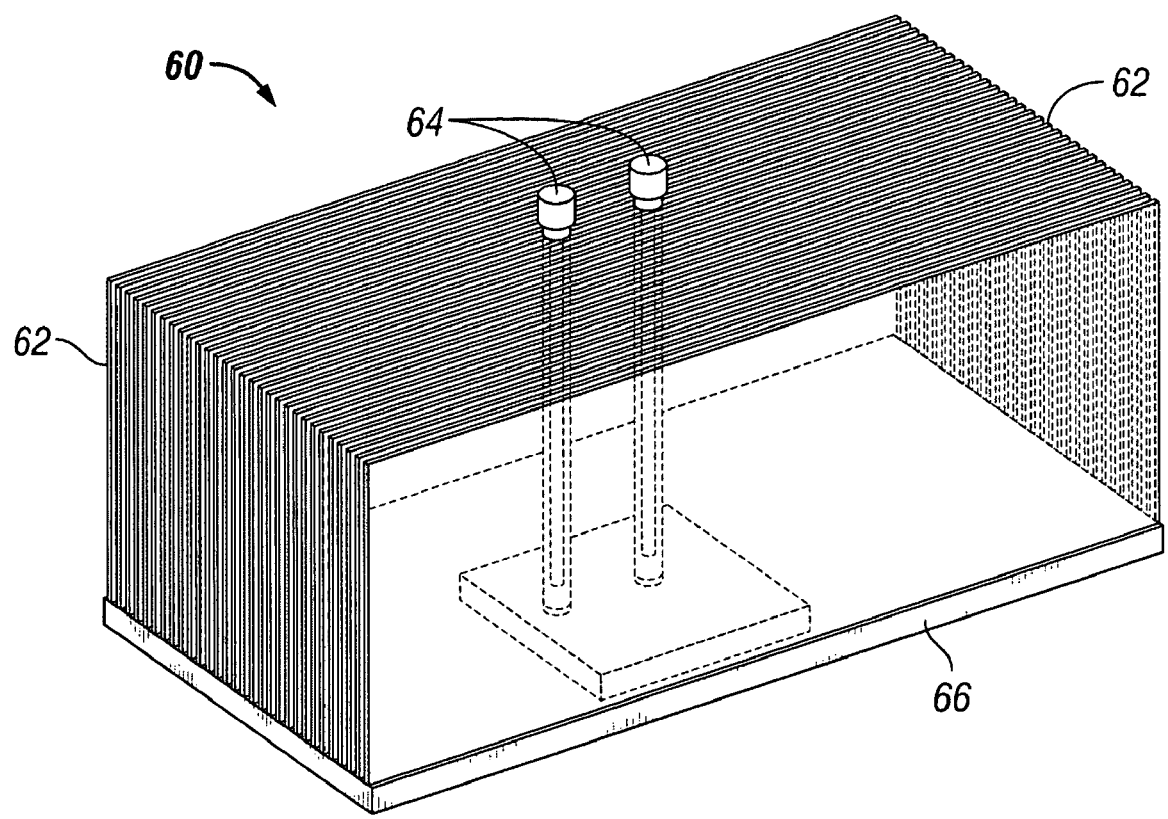
FIG. 4A shows a top-side view of a heat sink in accordance with an embodiment of the present invention.

FIG. 4A shows a top-side view of an exemplary heat sink 60 in accordance with an embodiment of the present invention. The heat sink 60 has a plurality of "fins" 62 arranged to dissipate heat. In one or more embodiments of the present invention, the heat sink 60 may also have a base plate 66 that is arranged to attach to an integrated circuit 68 as shown in FIG. 4B.

Figure 4B:
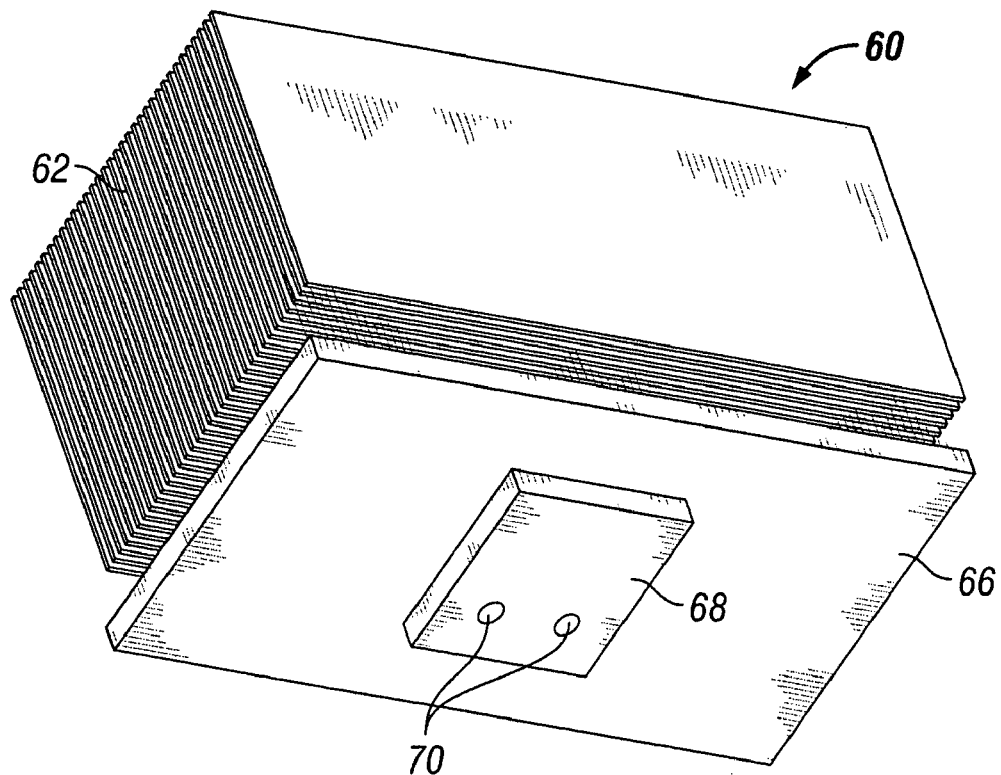
FIG. 4B shows a bottom-side view of a heat sink in accordance with an embodiment of the present invention.

Referring now to both FIGS. 4A and 4B, when the base plate 66 is positioned atop and in attachment with the integrated circuit 68, at least a portion of each of one of the ends of pipes 64 disposed within the heat sink 60 is oriented vertically over a hot spot 70 of the integrated circuit 68. As further described below with reference to FIGS. 6-11, pipes 64 are arranged to (i) carry fluid toward hot spots 70 for transferring heat away from hot spots 70 and (ii) carry fluid having heat transferred from hot spots 70 away from hot spots 70.

Figure 5A:
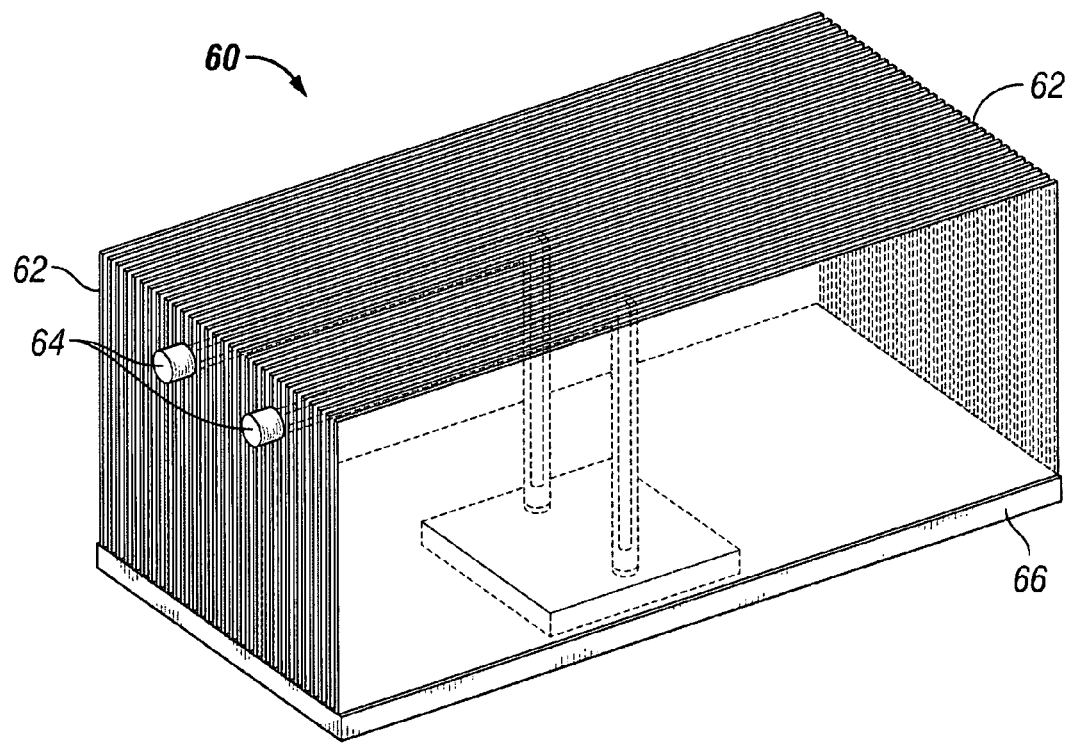
FIG. 5A shows a top-side view of a heat in accordance with an embodiment of the present invention.

As shown in FIG. 4A, pipes 64 extend linearly through the heat sink 60. Specifically, in FIG. 4A, pipes 64 linearly extend between a bottom of the heat sink 60 and a top of the heat sink 60. However, in one or more other embodiments of the present invention, pipes 64 may be configured to extend between a bottom of the heat sink 60 and one or more sides of the heat sink 60 as exemplarily shown in FIGS. 5A and 5B.

Figure 5B:
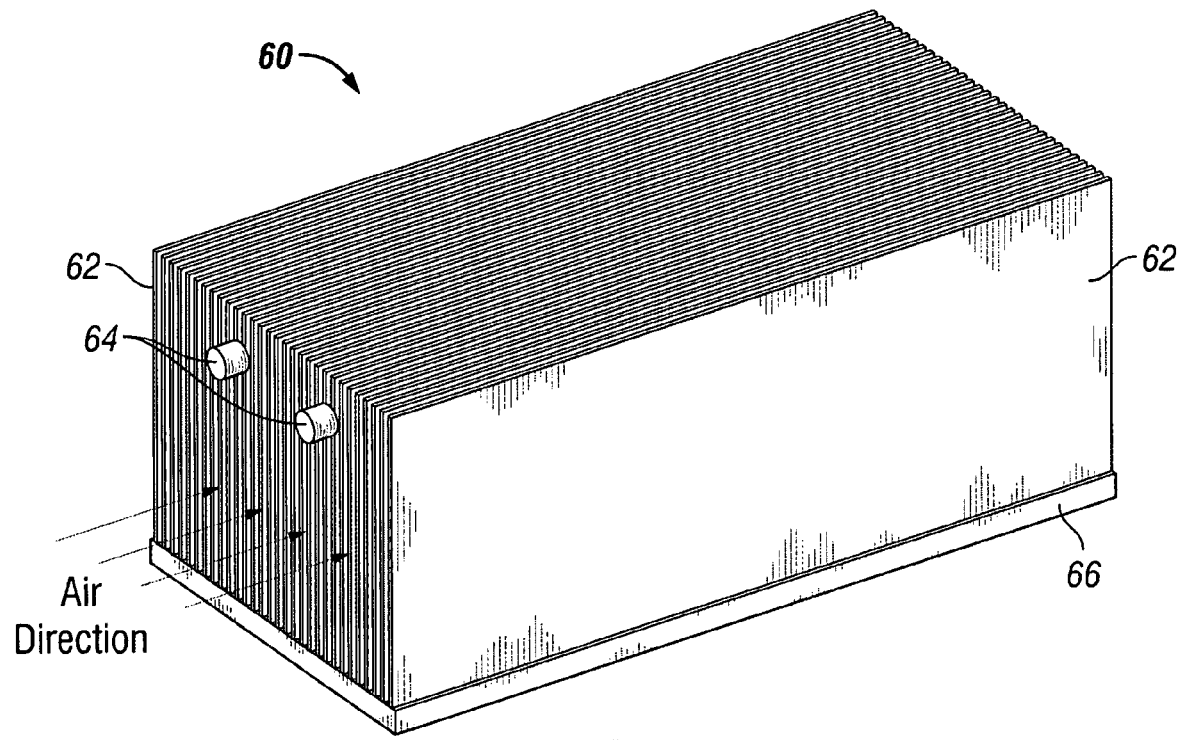
FIG. 5B shows a top-side view of a heat sink in accordance with an embodiment of the present invention.

Those skilled in the art will note that air may be directed to the heat sink 60 dependent on a configuration of pipes 64. For example, as shown in FIG. 5B, air is directed to a side of the heat sink 60 where pipes 64 protrude (air flow direction indicated by arrows). Those skilled in the art will further note that air directed to heat sink 60 may be specifically cooled and/or may be directed by fans and/or vents.

In one or more embodiments of the present invention, one or more of fins 62, pipes 64, and base plate 66 may be formed of a thermally conductive material. For example, one or more of fins 62, pipes 64, and base plate 66 may be formed of copper.

Further, in one or more embodiments of the present invention, a heat sink may have a different fin configuration than that shown in FIGS. 4A, 4B, 5A, and 5B. Moreover, those skilled in the art will note that the heat sink 60 shown in FIGS. 4A, 4B, 5A, and 5B is not necessarily to scale and is not limited to a particular length, width, and/or height.

Further, although the heat sink 60 shown in FIGS. 4A, 4B, 5A, and 5B has two pipes 64, in one or more other embodiments of the present invention, a different number of pipes may be used.

Figure 6:
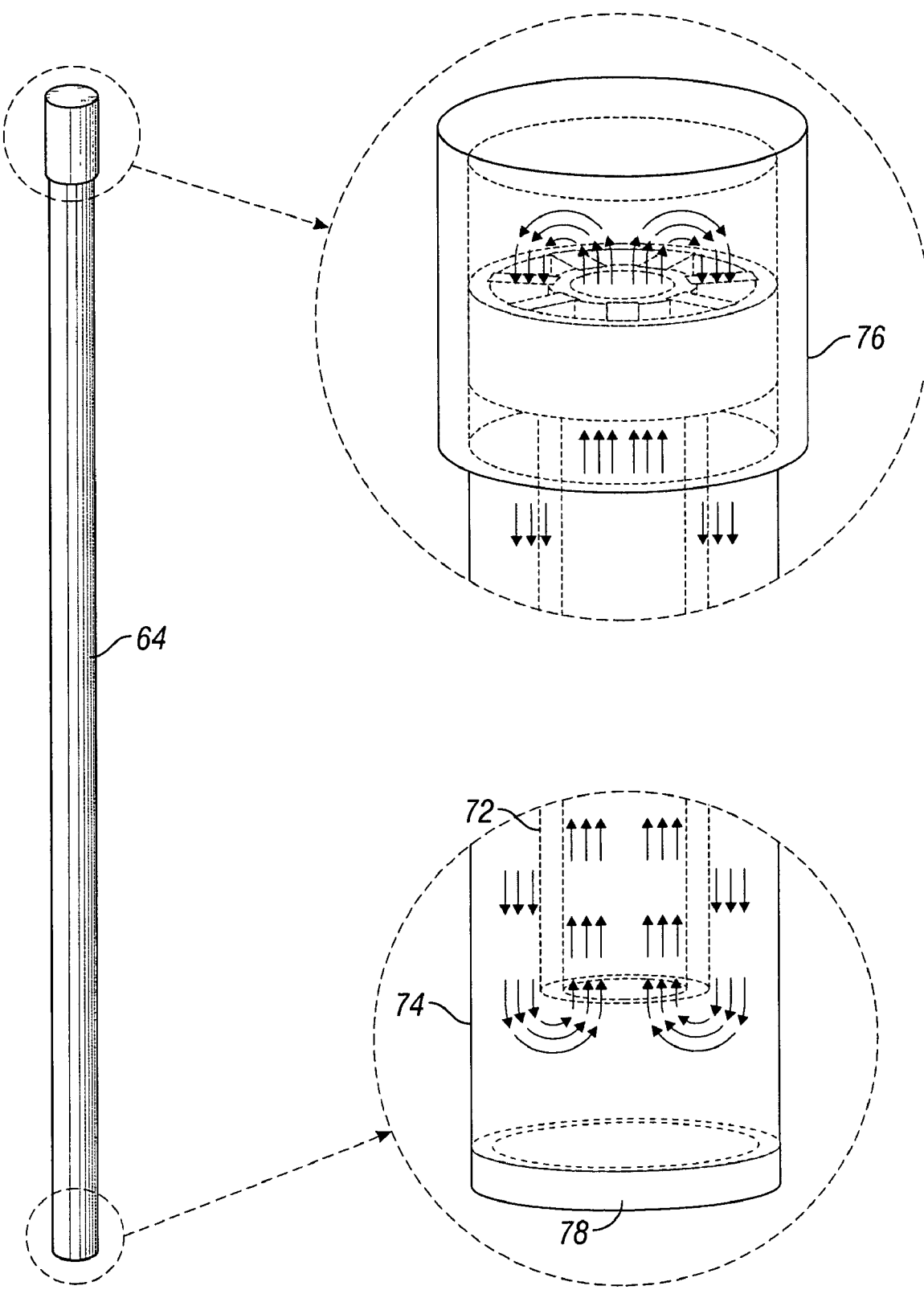
FIG. 6 shows a portion of a heat sink in accordance with an embodiment of the present invention.
Figure 7:
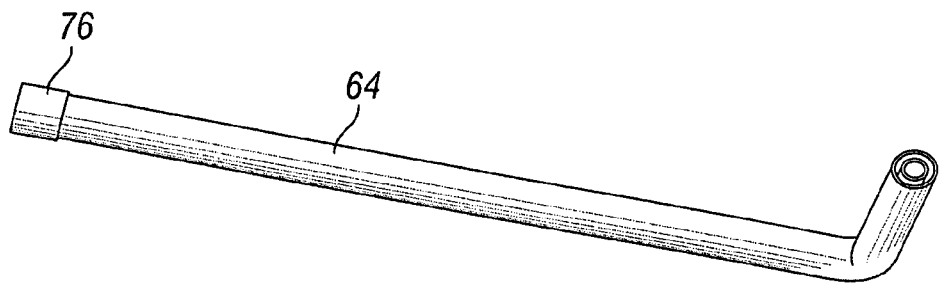
FIG. 7 shows a portion of a heat sink in accordance with an embodiment of the present invention.

FIG. 6 shows an exemplary pipe 64 in accordance with an embodiment of the present invention. Pipe 64 is formed of two concentric pipes 72, 74. One end of pipe 64 has housed in an assembly 76 for controlling the direction of fluid flow in pipes 72, 74. The other end of pipe 64 may be sealed by a cap 78. As discernible from FIG. 6, in one or more embodiments of the present invention, assembly 76 may be disposed on the end of pipe 64 that is not disposed over a hot spot of an integrated circuit. Further, in one or more other embodiments of the present invention, pipe 64 may be configured differently than that shown in FIG. 6. For example, pipe 64 may be bent in a particular orientation as exemplarily shown in FIG. 7.

As indicated by the arrows shown in FIG. 6, (i) fluid directed away from a hot spot of an integrated circuit (not shown) is carried up by pipe 74 and (ii) fluid directed toward the hot spot is carried down along the sides of pipe 72 around the outside surface of pipe 74. Those skilled in the art will note that the fluid carried by pipes 72, 74 may be thermally conductive so as to be capable of transferring heat away from one or more hot spots of an integrated circuit. Further, the pipes 72, 74 themselves may be formed of a thermally conductive material. For example, pipes 72, 72 may be formed of copper.

Figure 8A:
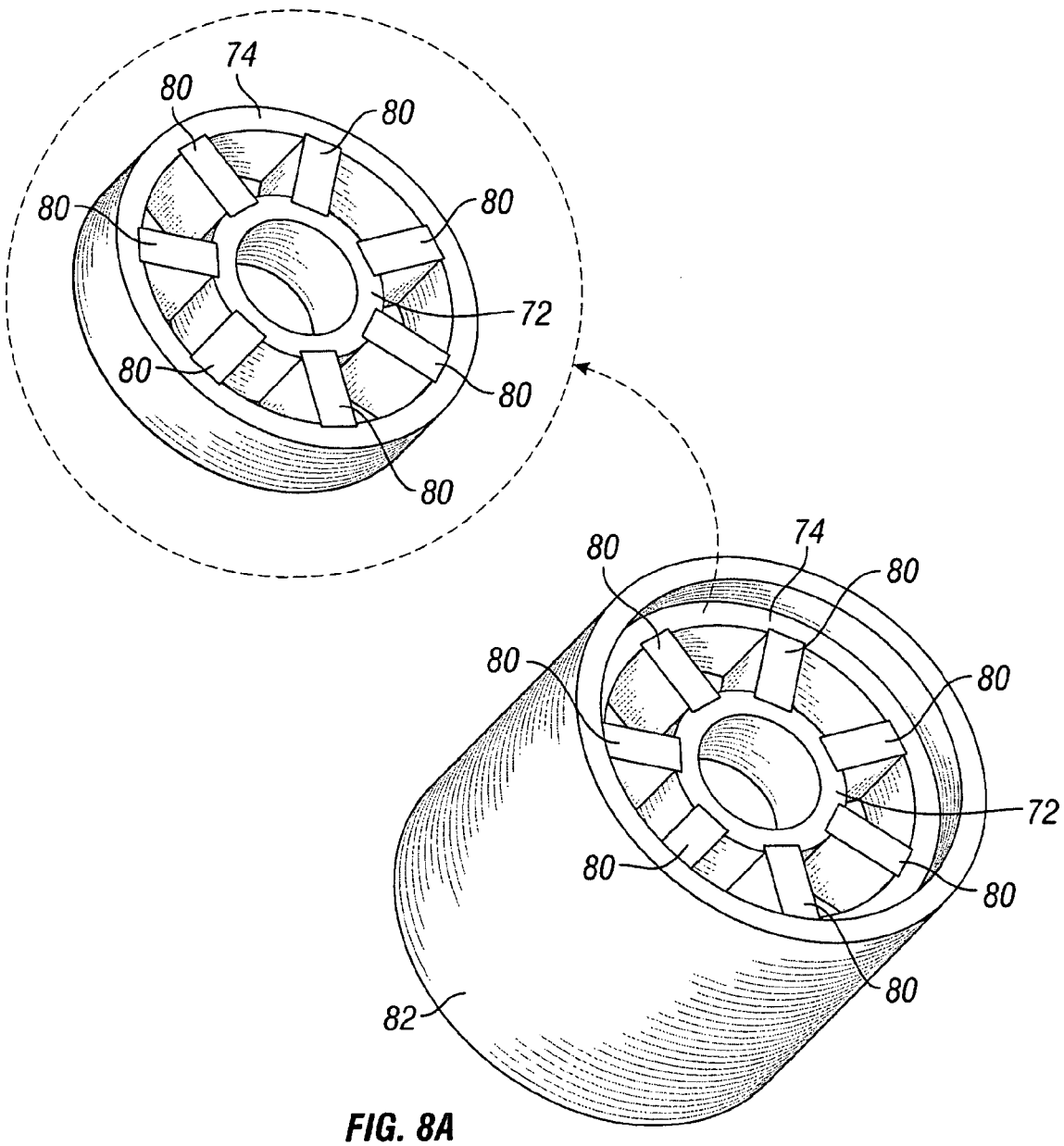
FIG. 8A shows a portion of a heat sink in accordance with an embodiment of the present invention.
Figure 8B:
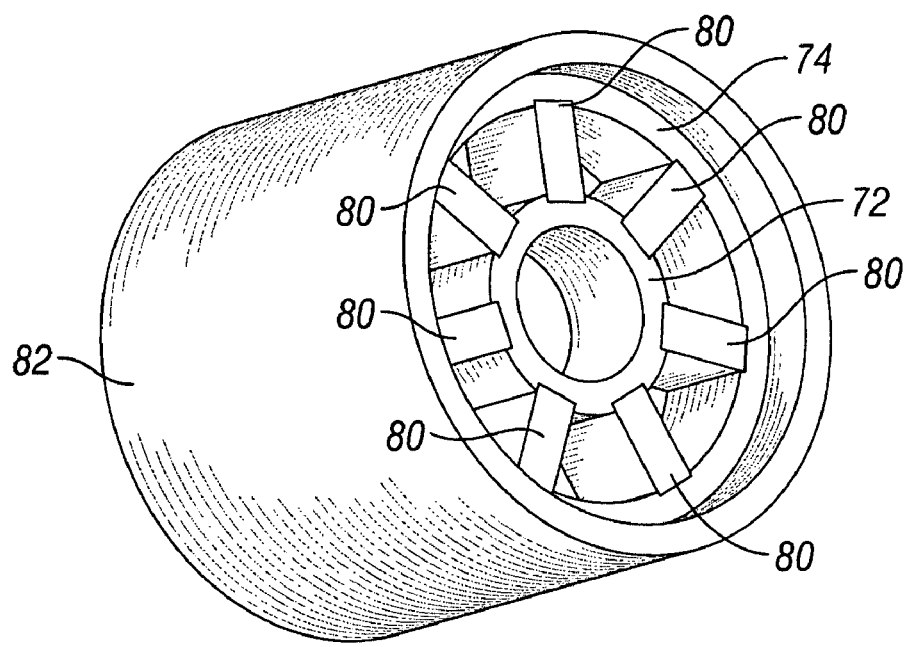
FIG. 8B shows a portion of a heat sink in accordance with an embodiment of the present invention.

As described above, the flow of fluid within pipes 72, 74 is controlled by assembly 76. FIGS. 8A and 8B show an exemplary assembly 76 in accordance with an embodiment of the present invention. Assembly 76 houses portions of concentric pipes 72, 74. A plurality of magnets 80 are disposed between pipe 72 and 74. As shown in FIGS. 8A and 8B, the plurality of magnets 80 are disposed uniformly between pipe 72 and 74. However, in one or more other embodiments of the present invention, the plurality of magnets 80 may not be uniformly disposed between pipe 72 and pipe 74.

Further, in order to shield a magnetic field induced using magnets 80 as further described below with reference to FIGS. 9-11, a ferromagnetic metal piece 82 may be used to house assembly 76. The ferromagnetic metal piece 82 may be formed of, for example, iron, nickel, and/or cobalt.

Those skilled in the art will note that in one or more other embodiments of the present invention, a different arrangement and/or amount of magnets than that shown in FIGS. 8A and 8B may be used.

Figure 9:
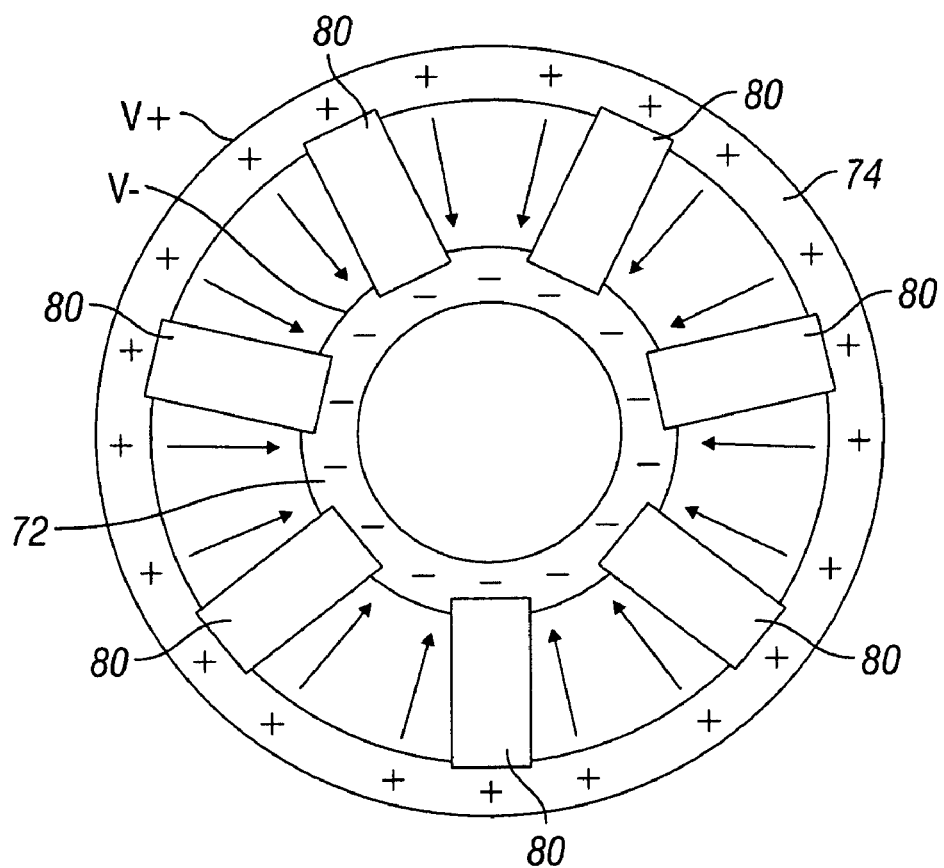
FIG. 9 shows a portion of a heat sink in accordance with an embodiment of the present invention.

Referring now to FIG. 9, a voltage differential is set up between pipe 72 and pipe 74. Specifically, in FIG. 9, a voltage applied to pipe 74 is higher than a voltage applied to pipe 72. In such a manner, an electrical current is induced between pipes 72, 74. The direction of electrical current induced when pipe 74 is of a higher voltage potential than pipe 72 is indicated by the arrows shown in FIG. 9.

Figure 10:
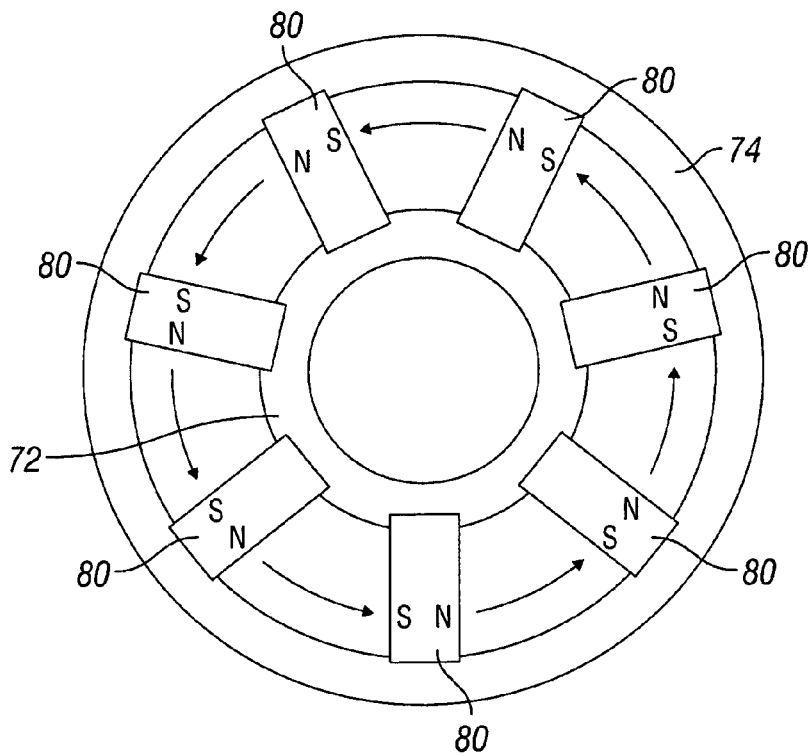
FIG. 10 shows a portion of a heat sink in accordance with an embodiment of the present invention.

The electrical current described above with reference to FIG. 9 flows across magnetic fields induced between magnets 80 as shown in FIG. 10. Specifically, in FIG. 10, magnets 80 are oriented such that poles of opposite polarities oppose each other. Such orientation of magnets 80 results in a magnetic field direction as shown in FIG. 10.

In one or more embodiments of the present invention, fluid in pipes 72, 74, in addition to being thermally conductive, may be electrically conductive. Thus, the direction of flow of fluid in pipes 72, 74 is dependent on magnetic field directions induced by magnets 80 and the direction of electrical current induced between pipes 72, 74. Those skilled in the art will note that dependency is dictated by what is known in the art as the "right-hand" rule.

Figure 11:
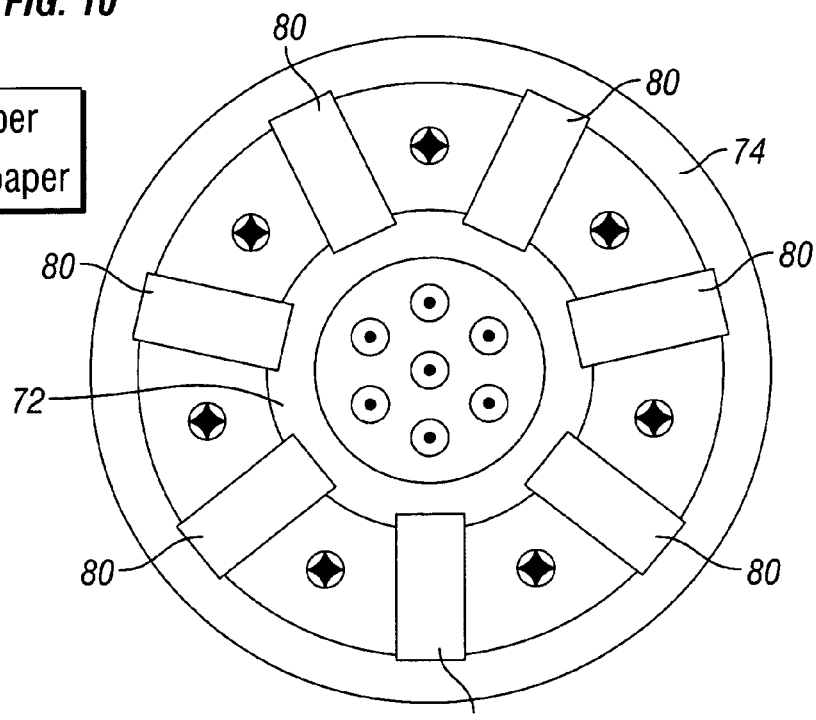
FIG. 11 shows a portion of a heat sink in accordance with an embodiment of the present invention.

Referring to FIG. 11, when (i) electrical current is induced as exemplarily shown in FIG. 9 and (ii) magnetic fields are induced in the direction exemplarily shown in FIG. 10, electrically conductive fluid in pipe 72 flows out from a plane of the sheet showing FIG. 11, and electrically conductive fluid in pipe 74 flows into a plane of the sheet showing FIG. 11.

Those skilled in the art will note that in one or more other embodiments of the present invention, the directions of fluid flow in pipes 72, 74 as shown in FIG. 11 may be reversed by (i) changing the orientation of the poles of magnets 80 and/or (ii) changing the direction of electrical current flow induced between the pipes 72, 74.

Further, those skilled in the art will note that the rate of fluid flow in pipes 72, 74 may be adjusted by (i) adjusting the strength of magnets 80 and/or (ii) adjusting the magnitude of electrical current flow between pipes 72, 74.

By controlling fluid flow direction and rate as shown and described with reference to FIGS. 9-11, assembly 76 draws "heated" fluid away from a hot spot and directs "cooled" fluid toward the hot spot. More specifically, fluid near a hot spot is heated by the hot spot and then drawn away from the hot spot through the heat sink 60 via pipe 64 by assembly 76. As the "heated" fluid is propagated through the heat sink 60, heat is dissipated via, for example, heat sink fins 62. In other words, the fluid in heat sink 60 is thermally conductive, and accordingly, absorbs heat generated by the hot source and dissipates the heat to outside air via, for example, heat sink fins 62. This fluid, which has now dissipated heat absorbed previously from the hot spot, is then re-circulated back through the heat sink 60 via pipe 64 toward the hot spot by assembly 64 for further and/or continued cooling of the hot spot.

Further, those skilled in the art will note that in one or more embodiments of the present invention, an assembly used to drive fluid to cool a particular hot spot of an integrated circuit may have a different fluid flow rate than another assembly used to drive fluid to cool a different hot spot of the integrated circuit.

Those skilled in the art will note that although the embodiments of the heat sink 60 described above in FIGS. 4A-11 are designed to specifically cool one or more hot spots of an integrated circuit, embodiments of the present invention are not limited in regard to cooling other regions of the integrated circuit. For example, although hot spots of an integrated circuit may be desired to be cooled by pipes 64, the heat sink 60 itself may be used to transfer heat away from other regions of the integrated circuit.

Advantages of the present invention may include one or more of the following. In one or more embodiments of the present invention, a heat sink is designed to specifically cool one or more hot spots of an integrated circuit.

In one or more other embodiments of the present invention, energy otherwise needed to cool regions of an integrated circuit that do not necessarily require cooling may be saved.

In one or more other embodiments of the present invention, a thermal budget for cooling one or more hot spots of an integrated circuit may be reduced relative to a thermal budget needed to uniformly cool across an integrated circuit.

In one or more embodiments of the present invention, an assembly used to drive fluid flow in a pipe designed for specifically cooling an hot spot of an integrated circuit may be positioned on a top or side surface of a heat sink.

In one or more embodiments of the present invention, an assembly used to drive fluid flow in a pipe designed for specifically cooling an hot spot of an integrated circuit may be shielded so as to prevent magnetic field leakage from, for example, interfering with an operation of the integrated circuit.

In one or more embodiments of the present invention, because a heat sink uses an assembly that generates a magnetic field to drive fluid flow within the heat sink, the fluid flow rate may be increased, thereby resulting in increased heat transfer from a heat source to heat sink fins that dissipate heat to outside air.

In one or more embodiments of the present invention, an assembly for generating a magnetic field to drive fluid flow within the heat sink is at least partially shielded.

In one or more embodiments of the present invention, a heat sink uses an assembly for generating a magnetic field to induce particular fluid flow, where "cooled" fluid is directed toward a hot spot of an integrated circuit and "heated" liquid is directed away from the hot spot, thereby resulting in a "cooling" of the hot spot.

In one or more embodiments of the present invention, an assembly for generating a magnetic field to drive fluid flow within the heat sink is cylindrical and compact in design.

In one or more embodiments of the present invention, fluid flow within a heat sink may be easily changed so as to reverse the direction of fluid flow.

In one or more embodiments of the present invention, fluid flow within a heat sink may be reversed by changing the direction of electrical current induced in an assembly through which the fluid flows.

In one or more embodiments of the present invention, fluid flow within a heat sink may be reversed by changing the orientation of poles of magnets in an assembly though which the fluid flows.

In one or more embodiments of the present invention, a plurality of assemblies of a heat sink use separate magnetic fields, thereby providing the ability for particularly controlling rates of fluid flow associated with different hot spots of an integrated circuit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A heat sink, comprising:
   an electrically and thermally conductive fluid;
   a first pipe disposed interior to and concentric with a second pipe, wherein at least a portion of a first end of the first pipe and at least a portion of a first end of the second pipe are disposed vertically over a hot spot; and
   an assembly configured to generate a magnetic field and to induce an electrical current, wherein the electrical current flows through the magnetic field to propagate the electrically and thermally conductive fluid through the first pipe and the second pipe outside of the first pipe,
   wherein a direction of fluid flow in the first pipe and a direction of fluid flow in the second pipe are dependent on the magnetic field and the electrical current.

2. The heat sink of claim 1, further comprising:
   a shield configured to at least partially shield the magnetic field.

3. The heat sink of claim 1, wherein the assembly is further configured to adjust a rate of fluid flow in at least one of the first pipe and the second pipe by adjusting at least one of the magnetic field and the electrical current.

4. The heat sink of claim 1, wherein the assembly is disposed at a second end of at least a portion of the first pipe and a portion of the second pipe.

5. The heat sink of claim 4, wherein the first and second pipe contain at least one ninety degree bend.

6. The heat sink of claim 1, wherein the first pipe is configured to linearly extend through the heat sink.

7. The heat sink of claim 1, wherein the assembly is arranged to direct fluid in the second pipe away from the hot spot.

8. The heat sink of claim 1, wherein the assembly is arranged to direct fluid in the first pipe outside of the second pipe toward the hot spot.

9. The heat sink of claim 1, wherein the assembly further comprises:
   a plurality of magnets disposed between a portion of the first pipe and a portion of the second pipe.

10. The heat sink of claim 9, wherein the assembly further comprises:
    a ferromagnetic metal piece arranged to at least partially shield a magnetic field generated between the plurality of magnets.

11. The heat sink of claim 1, wherein the heat sink is operatively connected to an integrated circuit.

* * * * *